United States Patent
Huang et al.

(10) Patent No.: US 11,505,454 B2
(45) Date of Patent: Nov. 22, 2022

(54) MEMS STRUCTURE AND MANUFACTURING METHOD THEREOF

(71) Applicant: TAIWAN SEMICONDUCTOR MANUFACTURING COMPANY LTD., Hsinchu (TW)

(72) Inventors: Kang-Che Huang, Hsinchu (TW); Yi-Chien Wu, Taichung (TW); Shiang-Chi Lin, Taoyuan (TW); Jung-Huei Peng, Hsinchu Hsien (TW); Chun-Wen Cheng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/583,111

(22) Filed: Sep. 25, 2019

(65) Prior Publication Data

US 2021/0087056 A1 Mar. 25, 2021

(51) Int. Cl.
*B81C 1/00* (2006.01)

(52) U.S. Cl.
CPC ...... *B81C 1/00206* (2013.01); *B81C 1/00111* (2013.01); *B81C 2201/0169* (2013.01); *B81C 2201/115* (2013.01); *B81C 2203/0714* (2013.01)

(58) Field of Classification Search
CPC ................ B81C 1/00206; B81C 1/00111
See application file for complete search history.

(56) References Cited

U.S. PATENT DOCUMENTS

| | | | | |
|---|---|---|---|---|
| 2004/0164649 A1* | 8/2004 | Xu | ............ | H01L 41/094 310/328 |
| 2004/0259378 A1* | 12/2004 | Chambers | ......... | H01L 21/76834 438/771 |
| 2005/0030451 A1* | 2/2005 | Liu | ............ | G02F 1/134363 349/113 |
| 2005/0146835 A1* | 7/2005 | Hsu | ............ | H01L 27/1255 361/303 |
| 2007/0242341 A1* | 10/2007 | Natarajan | ........ | G02B 27/0006 359/290 |
| 2009/0267109 A1* | 10/2009 | Fukunaga | ........ | H01L 33/42 257/103 |
| 2010/0214230 A1* | 8/2010 | Chu | ............ | G06F 3/041 345/173 |
| 2011/0259717 A1* | 10/2011 | Pillans | ........ | H01H 57/00 200/181 |

(Continued)

*Primary Examiner* — Sheng-Bai Zhu
(74) *Attorney, Agent, or Firm* — WPAT Law; Anthony King

(57) ABSTRACT

A method for manufacturing a MEMS structure is provided. The method includes providing a MEMS substrate having a first surface, forming a first buffer layer on the first surface of the MEMS substrate, and forming a first roughening layer on the first buffer layer. Also, a MEMS structure is provided. The MEMS structure includes a MEMS substrate, a first buffer layer, a first roughening layer, and a CMOS substrate. The MEMS substrate has a first surface and a pillar is on the first surface. The first buffer layer is on the first surface. The first roughening layer is on the first buffer layer. The CMOS substrate has a second surface and is bonded to the MEMS substrate via the pillar. Moreover, an air gap is between the first roughening layer and the second surface of the CMOS substrate.

20 Claims, 12 Drawing Sheets

(56) References Cited

U.S. PATENT DOCUMENTS

| | | | |
|---|---|---|---|
| 2012/0119349 A1* | 5/2012 | Naba | C04B 41/515 |
| | | | 257/704 |
| 2014/0357012 A1* | 12/2014 | Toriyama | G02B 5/0268 |
| | | | 438/71 |
| 2015/0239774 A1* | 8/2015 | Lamine | C23C 14/5813 |
| | | | 428/213 |
| 2016/0145095 A1* | 5/2016 | Tsai | B81B 7/0048 |
| | | | 257/415 |
| 2017/0210612 A1* | 7/2017 | Chen | B81B 3/001 |
| 2017/0341933 A1* | 11/2017 | Shen | B81C 1/00825 |
| 2018/0088371 A1* | 3/2018 | Li | G02F 1/133512 |

* cited by examiner

MEMS STRUCTURE AND MANUFACTURING METHOD THEREOF

FIELD

The present disclosure is related to a microelectromechanical system (MEMS) structure and manufacturing method thereof and, more particularly, to an MEMS structure which includes a roughening layer with a roughness surface to alleviate the issue of surface stiction.

BACKGROUND

A microelectromechanical system (MEMS) device is a piece of technology with components on a very small scale. MEMS devices have found widespread use in many modern day electronic devices, and may have components within the micrometer size range and sometimes within the nanometer size range. A typical MEMS device may include processing circuitry as well as mechanical components, such as for various types of sensors. These sensors may be used as part of a Radio Frequency (RF) switch, gyroscope, accelerometer, microphone membrane, or motion sensor, responses from which are provided to and processed by the included processing circuitry. For example, MEMS accelerometers are commonly found in automobiles (e.g., in airbag deployment systems), tablet computers or in smart phones. For many applications, MEMS devices are electrically connected to application-specific integrated circuits (ASICs) to form complete MEMS systems.

The mechanical components of MEMS devices are often provided in chambers, in which the components are allowed to move. In the development of MEMS, the stiction of the components is a notable issue due to their large surface area-to-volume ratio. Stiction is closely related to surface forces, which greatly depend on the materials used, surface topography and surface treatment process.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
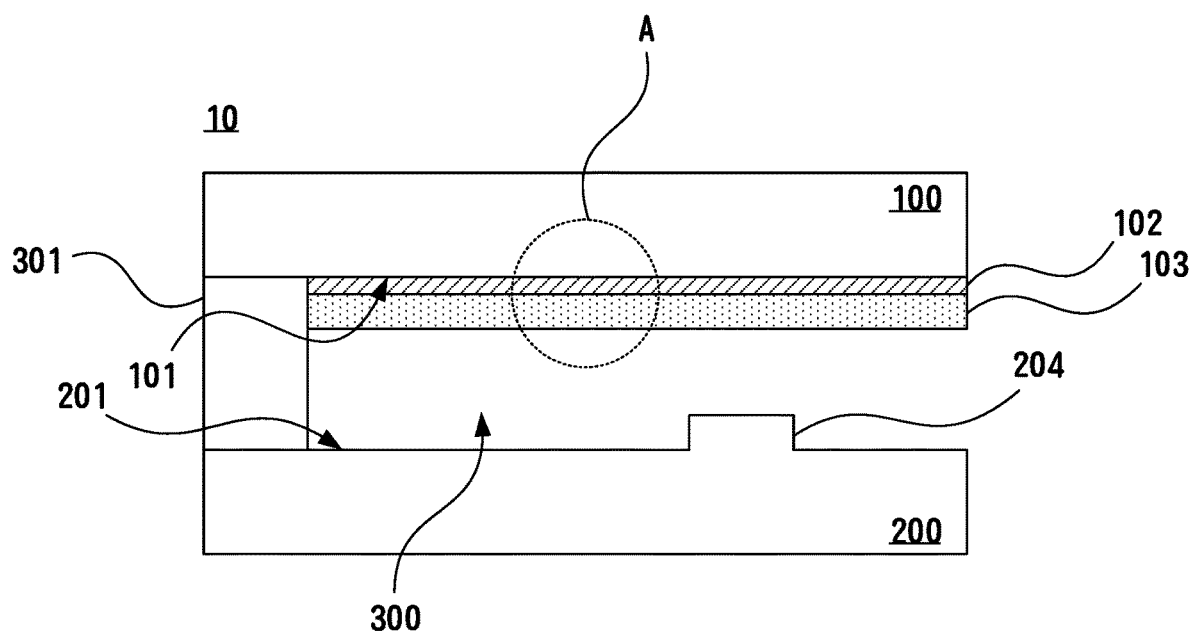
FIG. 1 illustrates a cross-sectional view of a MEMS structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Some MEMS devices, such as gyroscope, accelerometer, microphone membrane, or motion sensor, comprise a moveable portion and a neighboring fixed electrode plate arranged within a cavity. The moveable portion is moveable or flexible with respect to the fixed electrode plate in response to external stimuli, such as acceleration, pressure, or gravity. A distance variation between the moveable portion and the fixed electrode plate is detected through the capacitive coupling of the moveable portion and the fixed electrode plate and transmitted to a measurement circuit for further processing.

Due to the moveable or flexible portions, MEMS devices have several production challenges. One significant challenge with MEMS devices is surface stiction. Surface stiction refers to the tendency of a moveable or flexible MEMS part to come into contact with a neighboring surface and stick to the neighboring surface. This stiction can occur at the end of manufacturing, such that the moveable or flexible portion is not quite released from the neighboring surface, or can occur during normal operation when the component suddenly becomes stuck to the neighboring surface. As feature sizes shrink for successive generations of technology, surface stiction is becoming an increasingly important consideration in MEMS devices. Surface stiction can arise due to any one of several different effects, such as capillary force, molecular Van der Waals force or electrostatic forces (e.g., Casimir effect) between neighboring surfaces. The extent to which these effects cause stiction can vary based on many different factors such as temperature of the surfaces, contact area between the surfaces, contact potential difference between the surfaces, whether the surfaces are hydrophilic or hydrophobic, and so on. Approaches have been used to attempt to limit surface stiction, for example, performing surface treatment or coating to the moveable portion or cavity surfaces to change hydrophilic properties of the surfaces. However, these approaches are difficult to integrate with various manufacturing processes and introduce contamination.

Accordingly, the present disclosure provide a MEMS structure and manufacturing method thereof that a roughening layer in the MEMS structure may provide enough roughness in avoiding the issue of stiction since the surface roughness of the roughening layer is in micrometer scale, as opposed to nanometer scale in some comparative embodiments. Also, such roughness of the roughening layer may be formed through the deposition operation directly and thereby it is more conducive for implementing.

Referring to FIG. 1, a MEMS structure is provided. The MEMS structure 10 includes a MEMS substrate 100, a first buffer layer 102, a first roughening layer 103, and a CMOS substrate 200. The MEMS substrate 100 has a first surface 101. The CMOS substrate 200 has a second surface 201 opposing to the first surface 101. In some embodiments, an air gap 300 is between the first roughening layer 103 and the second surface 201 of the CMOS substrate 200.

In some embodiments, the MEMS substrate 100 is a silicon wafer, but also may comprise silicon oxide, metal oxide, the like, and/or a combination thereof. In some embodiments, the MEMS substrate 100 is bonded over the CMOS substrate 200. For example, as shown in FIG. 1, a pillar 301 is on the first surface 101 of the MEMS substrate 100, and the CMOS substrate 200 is bonded to the MEMS substrate 100 via the pillar 301. The MEMS substrate 100 may be bonded over the CMOS substrate 200 via the pillar 301 by using a eutectic bonding. In some embodiments, the CMOS substrate 200 is also a silicon wafer.

The first buffer layer 102 is on the first surface 101 of the MEMS substrate 100. The first roughening layer 103 is on the first buffer layer 102. In some embodiments, the thickness of the first roughening layer 103 is greater than that of the first buffer layer 102. In some embodiments, the thickness of the first roughening layer 103 is greater than about 100 nm.

As previous mentioned, the material of the MEMS substrate 100 includes silicon, whereas the first roughening layer 103 includes silicon nitride ($Si_3N_4$) and thus is different to the MEMS substrate 100. Particularly, the lattice constant of silicon is at about 0.5431 nm whereas the lattice constant of silicon nitride is at about 0.5507 nm, lattice mismatch may occur if the first roughening layer 103 is formed on the MEMS substrate 100 directly. Hence, the present disclosure disposes the first buffer layer 102 between the MEMS substrate 100 and the first roughening layer 103, wherein the first buffer layer 102 has a lattice constant between about 0.5431 nm and about 0.5507 nm. In some embodiments, the first buffer layer 102 includes indium tin oxide. Indium tin oxide is tin-doped indium oxide and usually is crystallized as a bixbyite cubic structure with a lattice constant at about 1.0117 nm (a), but after it is annealed, it may be crystallized to a rhombohedral corundum type structure with a lattice constant at about 0.5487 nm (a), which is close to that of the first roughening layer 103.

In some embodiments, the first buffer layer 102 and the first roughening layer 103 include crystalline structures allowing subsequent patterning operation to be performed thereon. For example, a portion of the first buffer layer 102 and the first roughening layer 103 are to be removed over the first surface 101 through a lithography operation. If any of the first buffer layer 102 and the first roughening layer 103 includes an amorphous structure, the lithography operation may not function effectively and layer peel-off may be observed.

The first roughening layer 103 in the present disclosure may alleviate the issue of stiction caused by attractive forces that occur on microscopic levels such as capillary force, molecular Van der Waals and Casimir effect in MEMS. In some embodiments, the first roughening layer 103 has a root mean square (RMS) surface roughness in a range of from about 0.8 μm to about 2.0 μm. Such surface roughness of the first roughening layer 103 may be calculated by the root mean square of a surface's measured microscopic peaks and valleys.

Figure 2:
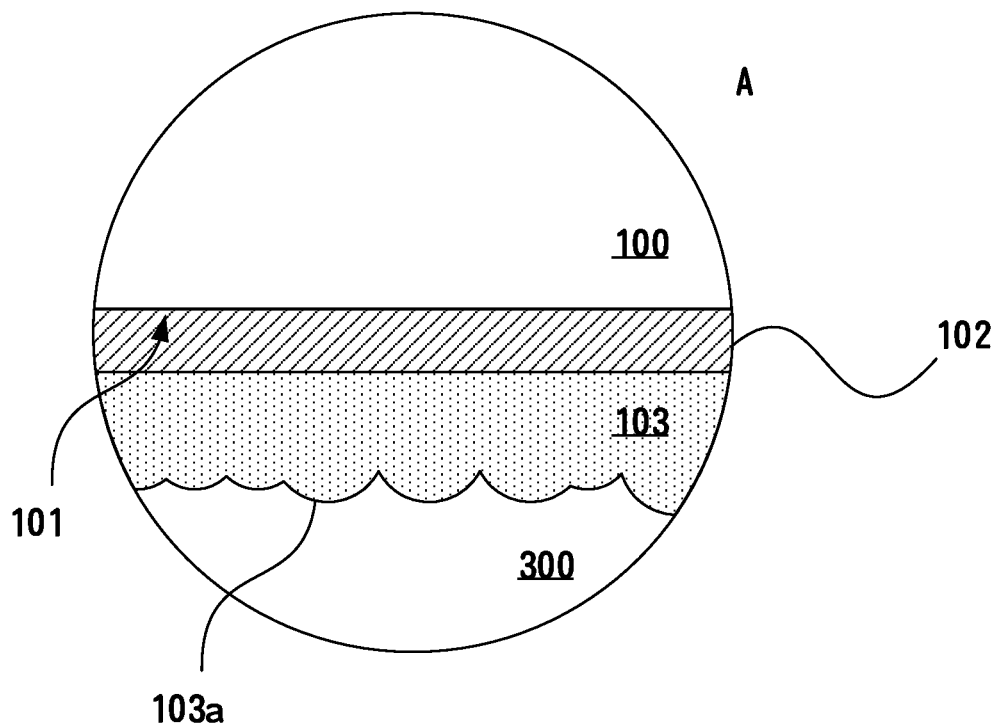
FIG. 2 illustrates an enlarged cross-sectional view of a portion of a MEMS structure in FIG. 1, according to some embodiments of the present disclosure.

Referring to FIG. 2, which a cross-sectional view of the MEMS structure enlarged from region A in FIG. 1 for showing the surface roughness of the first roughening layer 103. In some embodiments, the first roughening layer 103 has a morphology that includes a plurality of rounded islands 103a continuously connected. Each of the rounded islands has a diameter in a range from about 0.8 μm to about 2.0 μm and these rounded islands are randomly distributed at an upper surface of the first roughening layer 103. The rounded islands of the first roughening layer 103 may provide higher roughness in avoiding the issue of stiction since the surface roughness of the first roughening layer 103 is in micro scale instead of nano scale in rough polyamide.

Figure 3:
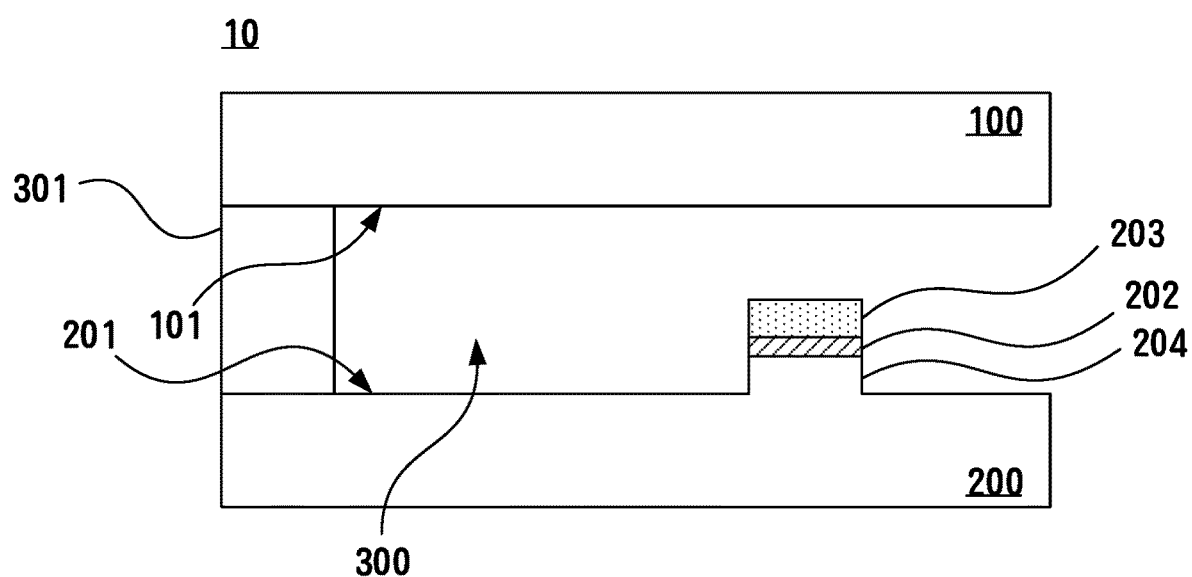
FIG. 3 illustrates a cross-sectional view of a MEMS structure according to some embodiments of the present disclosure.

In some embodiments, the buffer layer and the roughening layer may be disposed on the CMOS substrate 200 instead of the MEMS substrate 100. Referring to FIG. 3, in some embodiments, the MEMS structure 10 further includes a bump 204, a second buffer layer 202, and a second roughening layer 203. The bump 204 is on the second surface 201.

The second buffer layer 202 is on a top surface of the bump 204. The second roughening layer 203 is on the second buffer layer 202. The features of the second buffer layer 202 and the second roughening layer 203 are identical to the first buffer layer 102 and the first roughening layer 103 respectively. The bump 204 may performed as a stopper and decrease the contact area between the MEMS substrate 100 and the CMOS substrate 200 during in-use or in-manufacturing process of the MEMS structure 10, therefore the movable parts in the MEMS structure 10 may be restored easier since there is less contact area and less attractive forces may be generated. Also, the bump 204 may provide extra restore forces for the movable parts in the MEMS structure 10.

Figure 4:
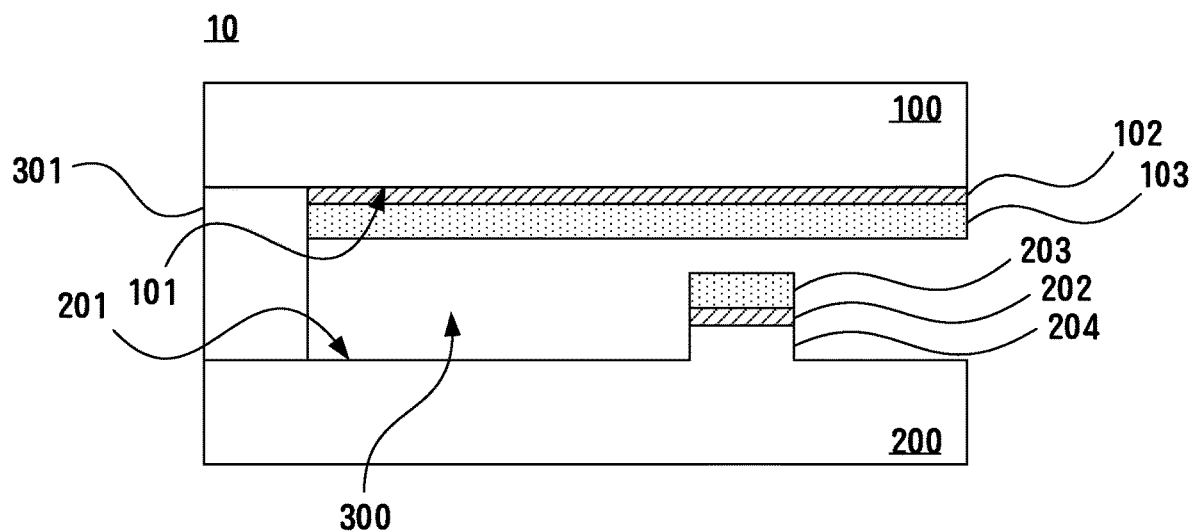
FIG. 4 illustrates a cross-sectional view of a MEMS structure according to some embodiments of the present disclosure.

In some embodiments, the buffer layer and the roughening layer may be both formed on the CMOS substrate 200 and the MEMS substrate 100. Referring to FIG. 4, the first buffer layer 102 and the first roughening layer 103 are formed on the first surface 101 of the MEMS substrate 100 sequentially, and also the second buffer layer 202 and the second roughening layer 203 are formed on the second surface 201 of the CMOS substrate 200 sequentially. The first roughening layer 103 may in contact the second roughening layer 203 during the working of the MEMS structure 10, and the roughness of the layers may generate less attractive force thereby the issue of stiction may be alleviated.

Figure 5:
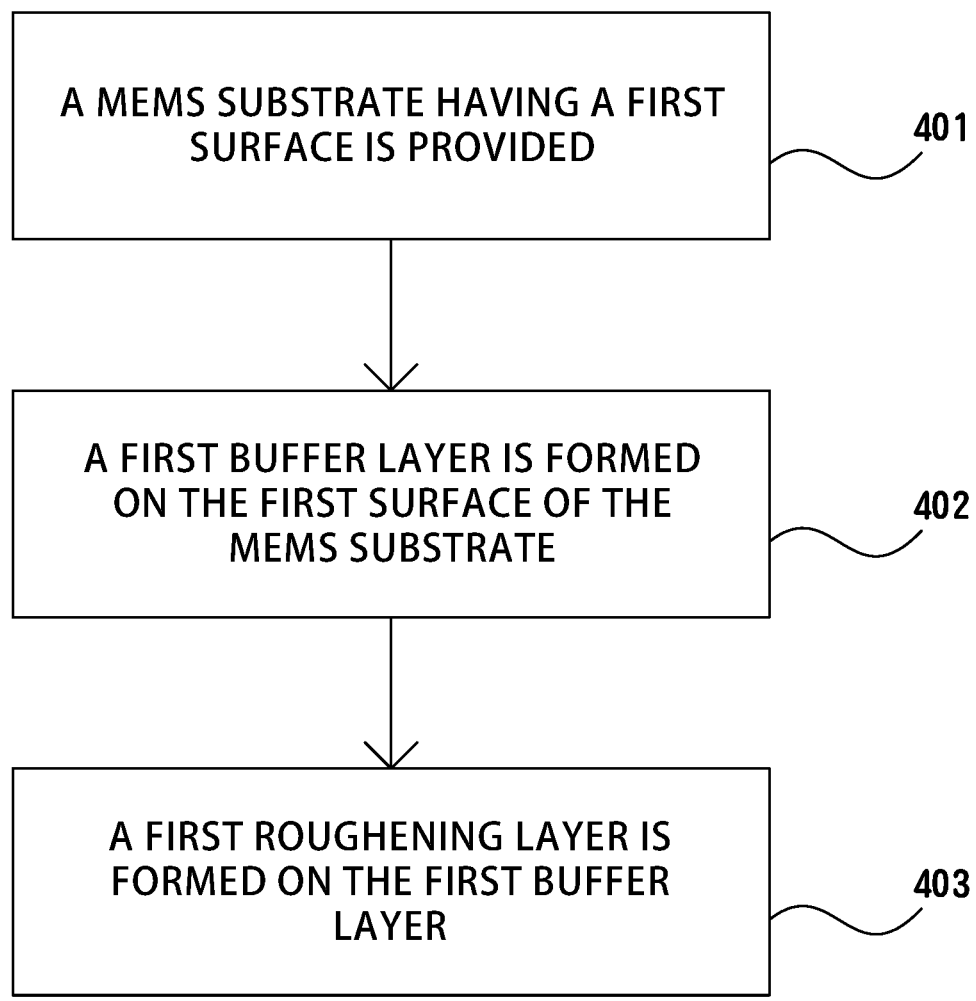
FIG. 5 illustrates a flow chart of a method for manufacturing a MEMS structure in accordance with some embodiments of the present disclosure.

FIG. 5 illustrates a method for manufacturing a MEMS structure. In some embodiments, at least a roughening layer is formed as a contact surface in the MEMS structure. That is, in some embodiments, a MEMS substrate 100 having a first surface 101 is provided in an operation 401. Next, the first buffer layer 102 is formed on the first surface 101 of the MEMS substrate 100 in an operation 402. In addition, a first roughening layer 103 is formed on the first buffer layer 102 in an operation 403.

Figure 6A:
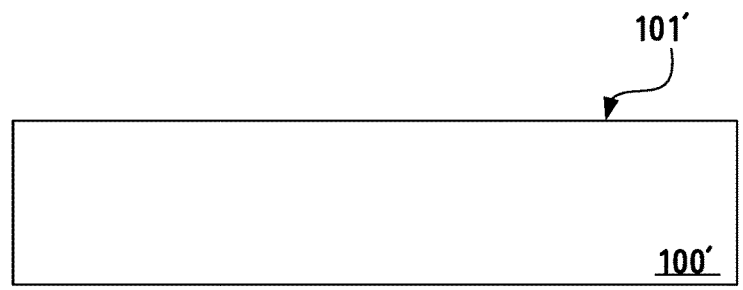
FIGS. 6A to 6E illustrate cross-sectional views at various operations of manufacturing a MEMS substrate according to some embodiments of the present disclosure.
Figure 6B:
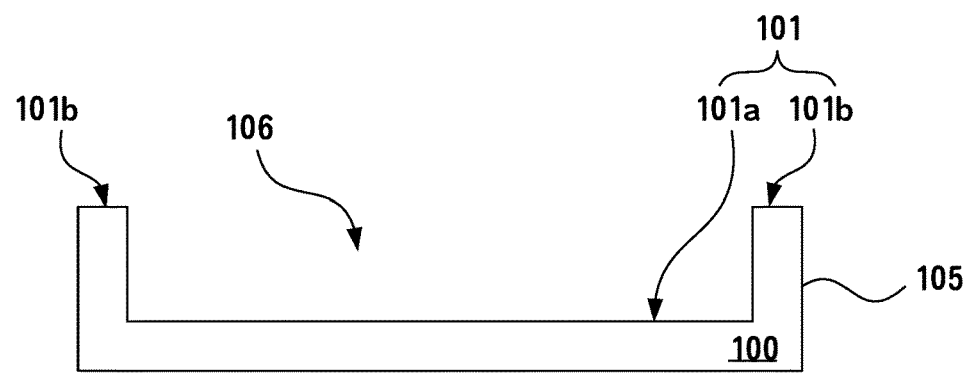
Figure 6C:
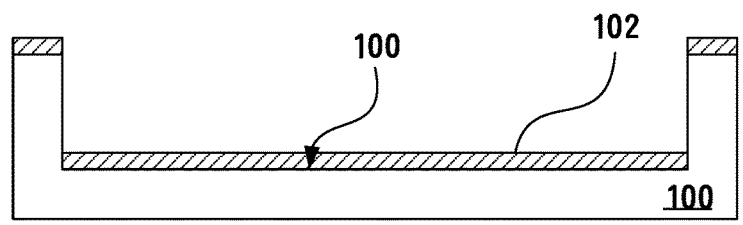

In some embodiments, the forming of the MEMS structure may include various operations. Referring to FIGS. 6A to 6G, the MEMS substrate may be formed from a flat substrate 100' as shown in FIG. 6A, and then a trench 106 is formed at the first surface 101' of the flat substrate 100' prior to forming the first buffer layer 102 as shown in FIGS. 6B and 6C. That is, a portion of the first surface 101 is leveled down to provide a space for forming the air gap 300 (as previously shown in FIGS. 1 to 3). Two protrusions 105 are also formed accordingly.

In such embodiments, the first surface 101 may be divided into different regions. The region 101a is for depositing the buffer layer and the region 101b is for bonding. As shown in FIGS. 6B and 6C, the first buffer layer 102 may be formed on the first surface 101 directly. In some embodiments, the first buffer layer 102 may be formed by density plasma (HDP), chemical vapor deposition (CVD), plasma enhanced CVD, sputter, spin-on, physical vapor deposition (PVD), or other applicable methods. As aforementioned, the first buffer layer 102 is an indium tin oxide layer, and after the first buffer layer 102 is formed, this layer is further be annealed to ensure the first buffer layer 102 transforming into a crystallized film. In some embodiments, an annealing temperature for annealing the first buffer layer 102 is higher than about 200 degrees Celsius.

Figure 6D:
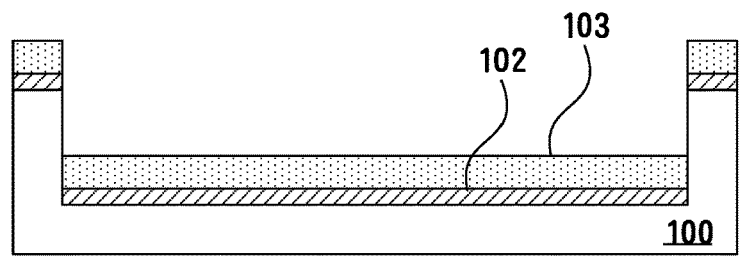

After the first buffer layer 102 is crystallized through annealing, the first roughening layer 103 is formed on the first buffer layer 102 as shown in FIG. 6D. The first roughening layer 103 may be formed by chemical vapor deposition (CVD) or plasma enhanced CVD. In some embodiments, the first roughening layer 103 is a silicon nitride layer. In some embodiments, a plurality of precursors including silane ($SiH_4$), ammonia ($NH_3$), and nitrogen gas ($N_2$) are supplied during the forming operation of the first roughening layer 103. In some embodiments, a depositing temperature for depositing the first roughening layer 103 is higher than about 200 degrees Celsius. In some embodiments, the depositing temperature for depositing the first roughening layer 103 is less than about 400 degrees Celsius.

The first roughening layer 103 in the present disclosure may have a hardness about 15 GPa because of the material of the first roughening layer 103 includes silicon nitride, whereas other materials such as polysilicon may provide a hardness about 10 GPa. Accordingly, the durability of the MEMS structure provided by the present disclosure may be enhanced and thereby it is indefectible in some rigorous circumstances such as testing or long time operation. Moreover, as in aforementioned embodiments, the depositing temperature for depositing the first roughening layer 103 may be in a range of from about 200 degrees Celsius to about 400 degrees Celsius, whereas the process temperature of forming a polysilicon layer as adopted in comparative embodiments may be up to about 600 degrees Celsius. In the comparative embodiments, surface roughness over the MEMS substrate is provided by forming a polysilicon layer, followed by forming an oxide layer over the polysilicon layer. The oxide layer is subsequently removed from the polysilicon surface. Optionally, an extra plasma surface treatment or an etch-back operation is applied and leaving a nanometer scale roughness over the polysilicon surface. The present disclosure includes a lower temperature film deposition operation at the absence of additional plasma surface treatment or etch-back operation, rendering better thermal budget control to the overall device manufacturing process. For example, stress induced by different coefficients of thermal expansion (CTE) among different interfacing materials can be effectively reduced.

Figure 6E:
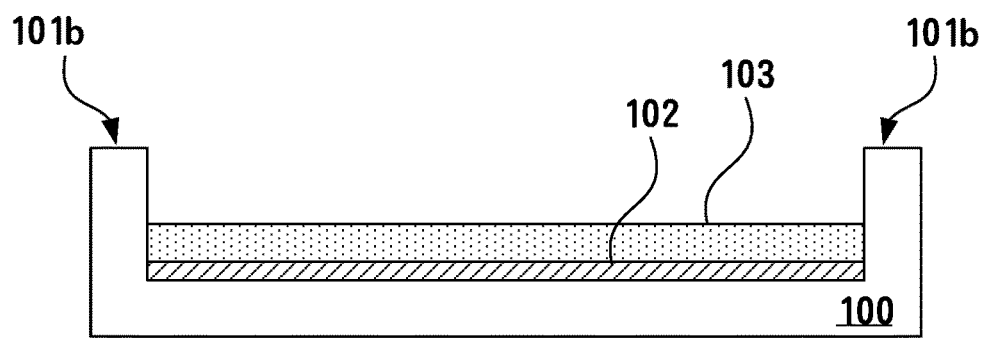

As shown in FIG. 6E, after the first roughening layer 103 is formed, the MEMS substrate 100 may be prepared to be bonded with the CMOS substrate. In some embodiments, in order to ensure the bonding quality, the first buffer layer 102 and the first roughening layer 103 over the regions 101b of the first surface are removed through a suitable lithography operation. Consequently, the regions 101b of the first surface of the MEMS substrate 100 are exposed and the CMOS substrate may be bonded thereon.

In some embodiments, the first buffer layer 102 and the first roughening layer 103 over the regions 101b of the first surface are removed by etching. Moreover, because the first buffer layer 102 is annealed and thereby crystallized in prior operations, it is more conducive for etching the first buffer layer 102 and the first roughening layer 103 without layer peel-off. More precisely, as long as a crystallized indium tin oxide layer is on the MEMS substrate 100, the layers over the MEMS substrate 100 may be patterned using suitable lithography operations and the etching rate may be controlled. Therefore the first roughening layer 103 may not be peeled-off as occur in some comparative embodiments where no annealing operation is applied to the indium tin oxide layer prior to the first roughening layer 103 formation, and hence such indium tin oxide being amorphous.

Figure 6F:
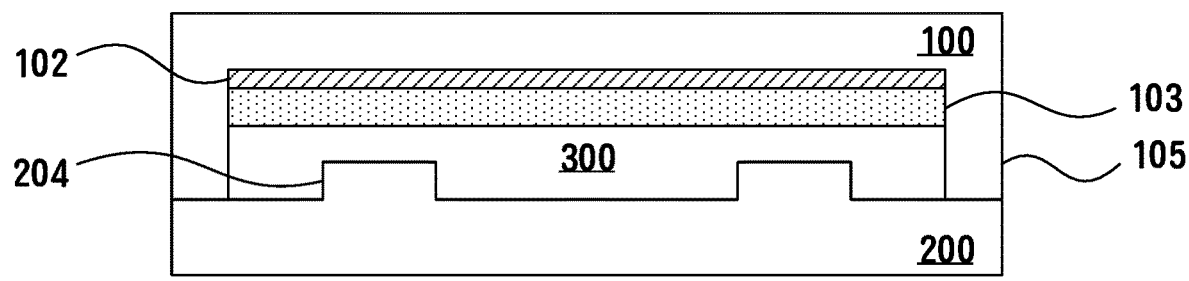
FIG. 6F illustrate a cross-sectional view at an operation of bonding a MEMS substrate to a CMOS substrate according to some embodiments of the present disclosure.

As shown in FIG. 6F, after the regions 101b of the first surface of the MEMS substrate 100 are exposed, the MEMS substrate 100 is bonded to the CMOS substrate 200 via, for example, a eutectic bonding operation. Meanwhile, the air gap 300 is formed between the first roughening layer 103 and the second surface 201 of the CMOS substrate 200 because of the height of the protrusion 302. In other words, the air gap 300 may be formed because the thickness of the bump 204 of the CMOS substrate 200 is lower than the depth of the trench 106 as previously formed in FIG. 6B. In some embodiments, the MEMS substrate 100 and the CMOS substrate 200 are bonded through a bonding material such as silicon oxide. The bonding material may be formed on the regions 101b (as previously shown in FIG. 6E) by chemical vapor deposition (CVD), atomic layer deposition (ALD), thermal treatments, sputtering, a chemical/electrochemical treatment, the like, and/or a combination thereof. In some embodiments, the bonding material is any material capable of forming a bond, for example, eutectic alloys. In some embodiments, the bonding operation illustrated in FIG. 6F may be a wafer-level process.

Figure 6G:
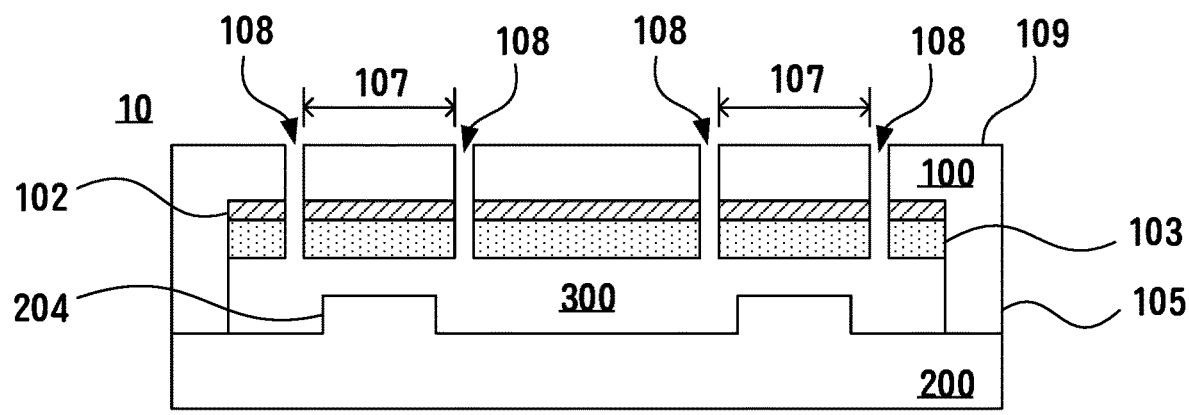
FIG. 6G illustrate a cross-sectional view at an operation of defining a movable portion of a MEMS substrate according to some embodiments of the present disclosure.

Referring to FIG. 6G, in some embodiments, after the MEMS substrate 100 and the CMOS substrate 200 are bonded, at least a movable portion 107 is defined at the MEMS substrate 100. The movable portion 107 may be defined by forming a plurality of openings 108 through the MEMS substrate 100, whereas the rest of the MEMS substrate may be a fixed portion 109. In some embodiments, the movable portion 107 is connected to the fixed portion 109 by one or more cantilever beams or springs (not shown). Through the defining operation, the movable portion 107 may be vertically aligned with the bumps 204 of the CMOS substrate 200. In some embodiments, the movable portion 107 may be defined by forming a pattern over the MEMS substrate 100 and applied etchants to the pattern, thus the openings 108 are formed thereafter.

In some embodiments, the MEMS structure further comprises a capping structure (not shown) disposed above the MEMS substrate 100, and which constitutes a cavity over the movable portion 107. The cavity may hermetically seal from the ambient environment surrounding the MEMS structure.

Figure 7A:
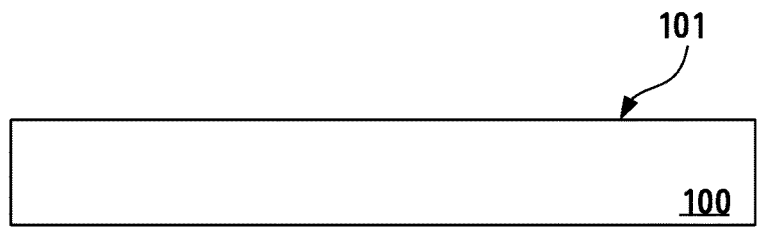
FIGS. 7A to 7D illustrate cross-sectional views at various operations of manufacturing a MEMS substrate according to some embodiments of the present disclosure.
Figure 7B:
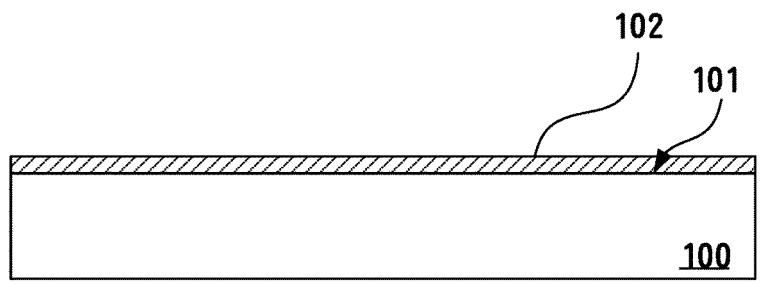

Referring to FIGS. 7A to 7D, in some embodiments, the MEMS substrate may be formed without leveling down a portion of the first surface 101. As shown in FIGS. 7A and 7B, the first buffer layer 102 may be formed on the first surface 101 of the MEMS substrate 100 directly. In some embodiments, the first buffer layer 102 may be formed by density plasma (HDP), chemical vapor deposition (CVD), plasma enhanced CVD, sputter, spin-on, physical vapor deposition (PVD), or other applicable methods. Next, the first buffer layer 102 is annealed in an annealing temperature higher than about 200 degrees Celsius to ensure the first buffer layer 102 transforming into a crystallized film.

Figure 7C:
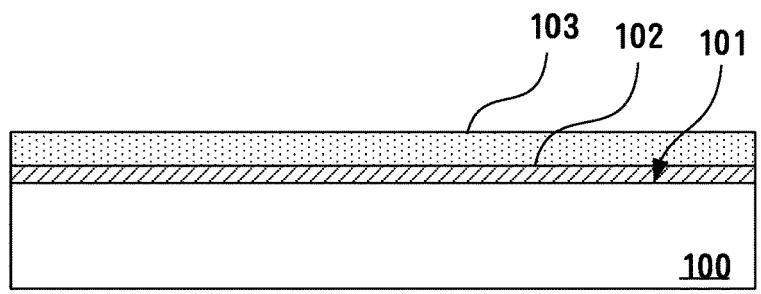

As shown in FIG. 7C, the first roughening layer 103 is formed on the first buffer layer 102 after it is crystallized through annealing. The first roughening layer 103 may be formed by chemical vapor deposition (CVD) or plasma enhanced CVD. In some embodiments, a plurality of precursors including silane ($SiH_4$), ammonia ($NH_3$), and nitrogen gas ($N_2$) are supplied during the forming operation and therefore the first roughening layer 103 is a silicon nitride layer.

Figure 7D:
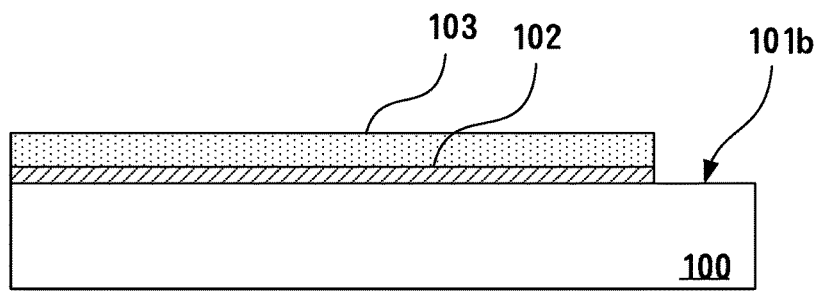

Referring to FIG. 7D, in order to bond the MEMS substrate to the CMOS substrate, in some embodiments, the first buffer layer 102 and the first roughening layer 103 over the regions 101b of the first surface are removed. Consequently, the region 101b of the first surface of the MEMS substrate 100 is exposed and the CMOS substrate may be bonded thereon.

Figure 7E:
FIGS. 7E to 7I illustrate cross-sectional views at various operations of manufacturing a CMOS substrate according to some embodiments of the present disclosure.
Figure 7F:
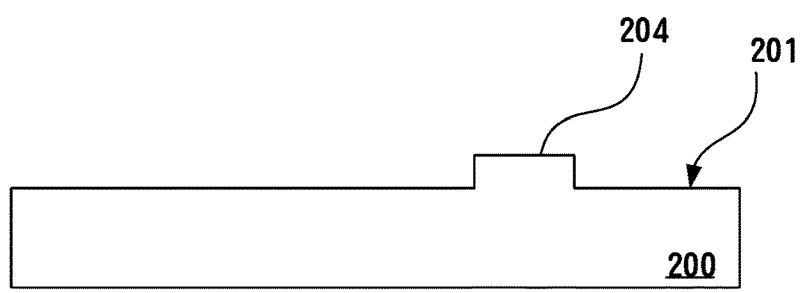
Figure 7G:
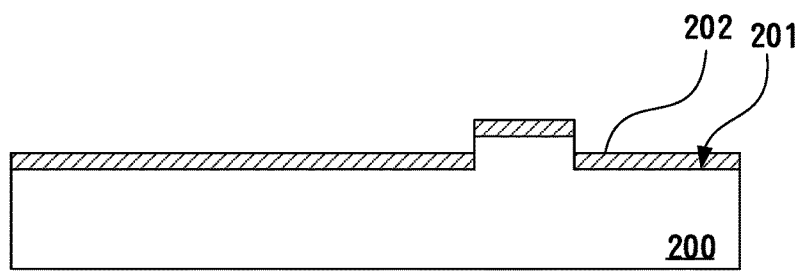

In the present disclosure, the buffer layer and the roughening layer not only may be formed on the MEMS substrate, but also formed on the CMOS substrate. As shown in FIGS. 7E and 7F, the CMOS substrate may be formed from a flat substrate 200' as shown in FIG. 7E, and then a bump 204 is defined at the second surface 201' of the flat substrate 200' prior to forming the second buffer layer 202 as shown in FIGS. 7F and 7G. In some embodiments, the second buffer layer 202 may be formed by density plasma (HDP), chemical vapor deposition (CVD), plasma enhanced CVD, sputter, spin-on, physical vapor deposition (PVD), or other applicable methods. The second buffer layer 202 is an indium tin oxide layer, and after the second buffer layer 202 is formed, this layer is further be annealed to ensure the second buffer layer 202 transforming into a crystallized film. In some embodiments, an annealing temperature for annealing the second buffer layer 202 is higher than about 200 degrees Celsius.

Figure 7H:
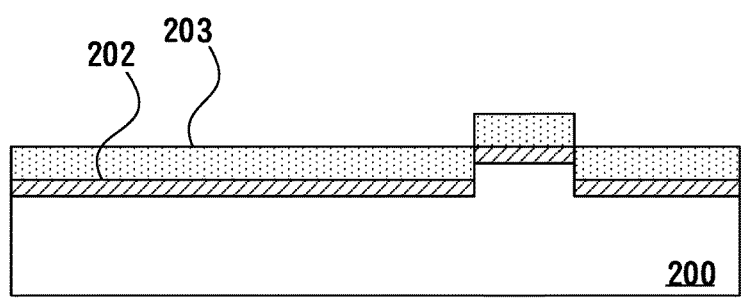

Next, the second roughening layer 203 is formed on the second buffer layer 202 as shown in FIG. 7H. The second roughening layer 203 may be formed by chemical vapor deposition (CVD) or plasma enhanced CVD. In some embodiments, the second roughening layer 203 is a silicon nitride layer. In some embodiments, a plurality of precursors including silane ($SiH_4$), ammonia ($NH_3$), and nitrogen gas ($N_2$) are supplied during the forming operation of the second roughening layer 203. In some embodiments, a depositing temperature for depositing the second roughening layer 203 is higher than about 200 degrees Celsius. In some embodiments, the depositing temperature for depositing the second roughening layer 203 is less than about 400 degrees Celsius.

Figure 7I:
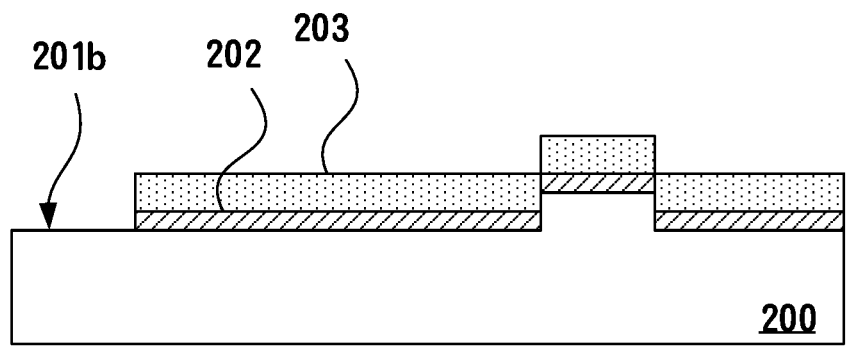

Similar with the MEMS substrate, at least a region of the CMOS substrate need to be exposed for bonding. As shown in FIG. 7I, in order to ensure the bonding quality, the second buffer layer 202 and the second roughening layer 203 over the regions 201b of the second surface are removed through a suitable lithography operation. Consequently, the regions 201b of the second surface of the CMOS substrate 200 are exposed and the MEMS substrate may be bonded thereon.

Figure 7J:
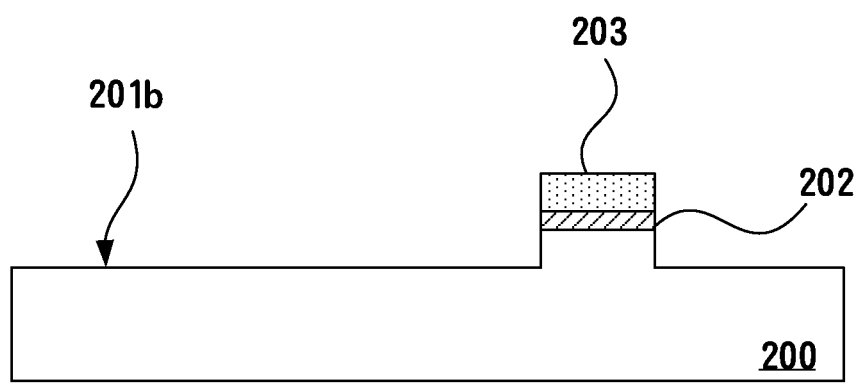
FIG. 7J illustrate a cross-sectional view at an operation of removing a portion of a second buffer layer and a second roughening layer from the CMOS substrate according to some embodiments of the present disclosure.

In some other embodiments, the area of the region 201b may be expanded. For instance, as shown in FIG. 7J, the region 201b includes the whole second surface except the region having the bump 204. That is, after the removal operation, the second buffer layer 202 and the second roughening layer 203 only left over the bump 204.

Figure 7K:
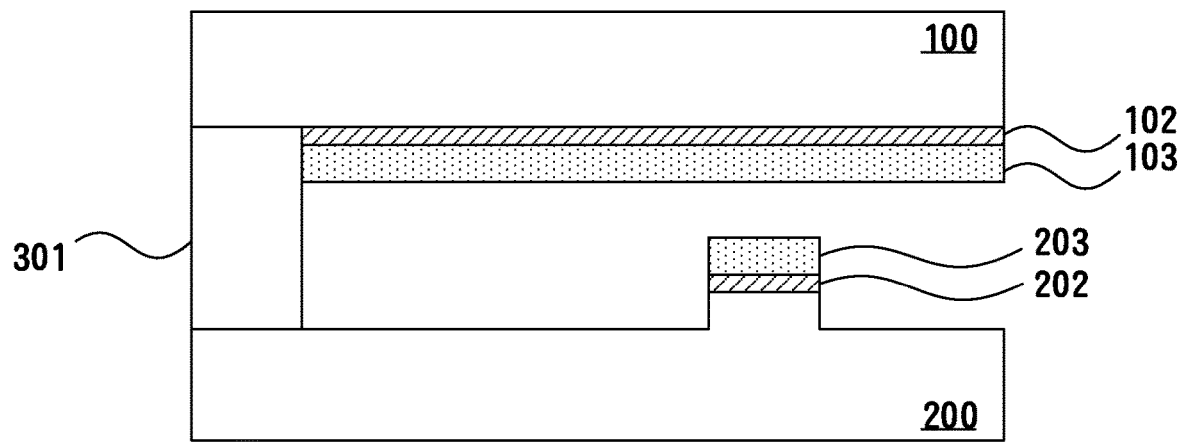
FIG. 7K illustrates a cross-sectional view at an operation of bonding a MEMS substrate to a CMOS substrate according to some embodiments of the present disclosure.

As shown in FIG. 7K, the MEMS substrate 100 is flipped and bonded to the CMOS substrate 200 through a pillar 301 contacting the first surface 101 and the second surface 201, more precisely, the pillar 301 is connected to the regions 101b and 201b as aforementioned. In some embodiments, the pillar 301 is a conductive pillar. In some embodiments, the MEMS substrate 100 and the CMOS substrate 200 are bonded through a semiconductor-to-metal bonding structure where the pillar 301 includes different portion, for example, a portion of the pillar 301 includes a metal material such as aluminum (Al), copper (Cu), titanium (Ti), tantalum (Ta), gold (Au), nickel (Ni), and tin (Sn), whereas another portion of the pillar 301 includes a semiconductor material such as germanium (Ge), silicon (Si), and silicon germanium (SiGe).

Figure 8:
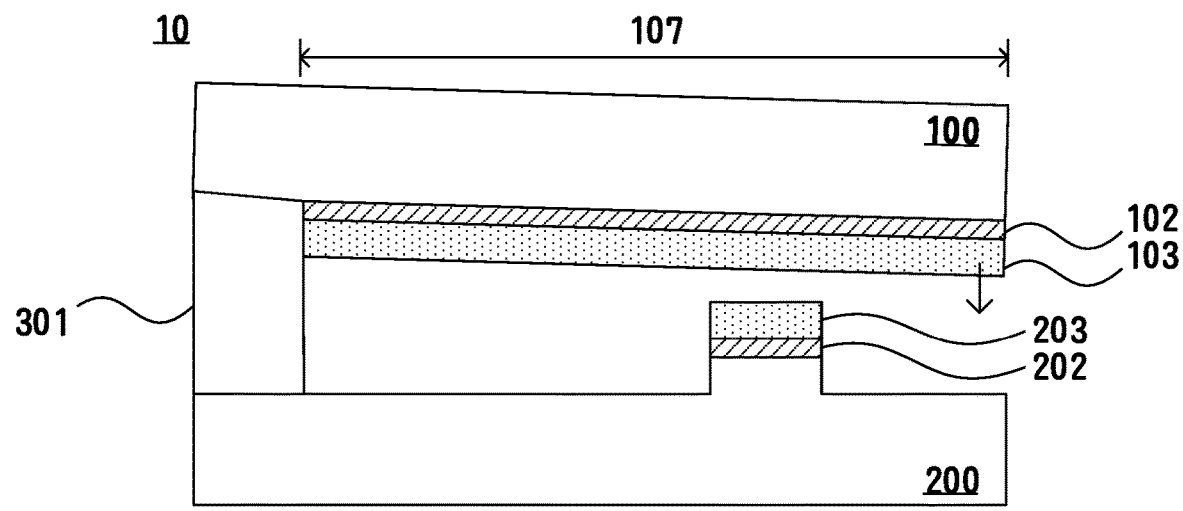
FIG. 8 illustrates a cross-sectional view of a MEMS structure in-use or in-manufacturing process, according to some embodiments of the present disclosure.

As shown in FIG. 8, the movable portion 107 is defined and may move toward the bump 204 of the CMOS substrate 200 during MEMS device operation or during subsequent manufacturing operation.

Figure 9:
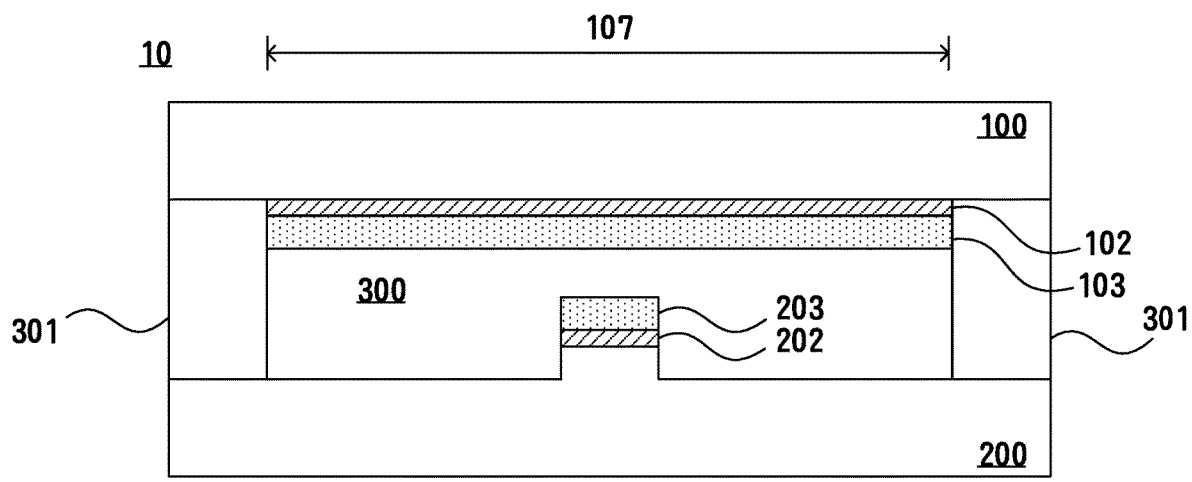
FIG. 9 illustrates a cross-sectional view of a MEMS structure according to some embodiments of the present disclosure.
Figure 10:
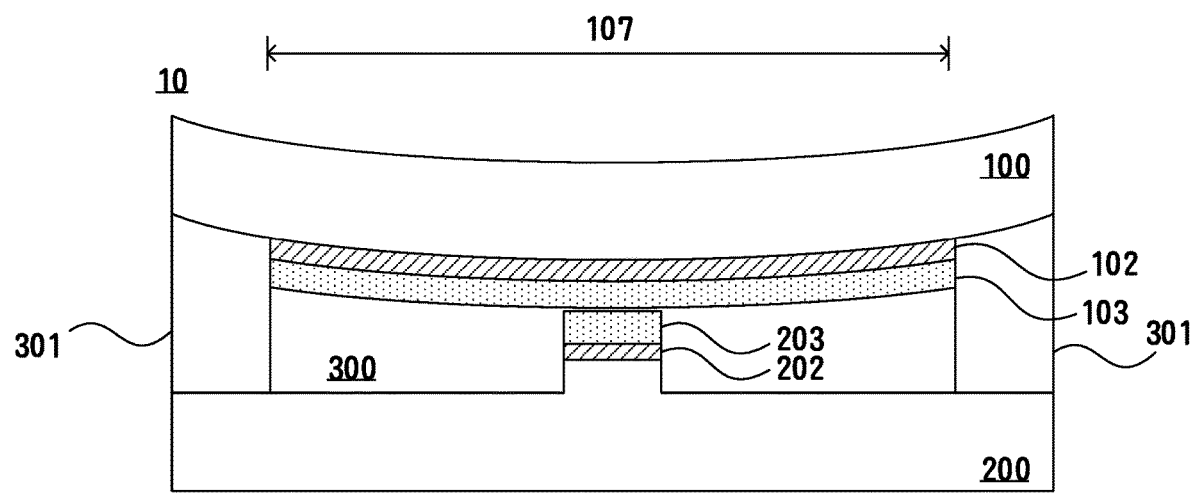
FIG. 10 illustrates a cross-sectional view of a MEMS structure in-use or in-manufacturing process, according to some embodiments of the present disclosure.

As shown in FIGS. 9 and 10, in some embodiments, the air gap 300 is enclosed by the pillars 301 between the MEMS substrate 100 and the CMOS substrate 200. In such embodiments, the first buffer layer 102, the first roughening layer 103, the second buffer layer 202 and the second roughening layer 203 on both ends of the MEMS substrate 100 and the CMOS substrate 200 respectively may be removed prior to bonding these substrates via the pillars 301.

As shown in FIG. 10, the movable portion 107 is defined and may move toward the bump 204 of the CMOS substrate 200 during MEMS device operation or during subsequent manufacturing operation.

In the present disclosure, a MEMS structure with at least an anti-stiction surface is provided. The anti-stiction surface is formed by depositing silicon nitride as a roughening layer over a crystalized indium tin oxide layer. The upper surface of the roughening layer includes a plurality of rounded islands continuously connected, which may provide a surface roughness in a range of from about 0.8 µm to about 2.0 µm. More precisely, the roughness of the surface of the roughening layer is formed through the depositing operation and there is no further etching operation to form a non-uniform surface. Based on the present disclosure, the issue of surface stiction may be alleviated due to the surface roughness, and the durability of the MEMS device also may be enhanced accordingly.

In one exemplary aspect, a method for manufacturing a MEMS structure is provided. The method includes providing a MEMS substrate having a first surface. The method further includes forming a first buffer layer on the first surface of the MEMS substrate. The method further includes forming a first roughening layer on the first buffer layer.

In another exemplary aspect, a method for manufacturing a MEMS structure is provided. The method includes providing a MEMS substrate having a first surface. The method further includes forming a first buffer layer on the first surface of the MEMS substrate. The method further includes forming a first roughening layer on the first buffer layer. The method further includes providing a CMOS substrate having a second surface. The method further includes forming a second buffer layer on the second surface of the CMOS substrate. The method further includes forming a second roughening layer on the second buffer layer. The method further includes bonding the MEMS substrate to the CMOS substrate through a conductive pillar contacting the first surface and the second surface.

In yet another exemplary aspect, a MEMS structure is provided. The MEMS structure includes: a MEMS substrate, a first buffer layer, a first roughening layer, and a CMOS substrate. The MEMS substrate has a first surface. A pillar is on the first surface. The first buffer layer is on the first surface. The first roughening layer is on the first buffer layer. The CMOS substrate has a second surface. The CMOS substrate is bonded to the MEMS substrate via the pillar. Moreover, an air gap is between the first roughening layer and the second surface of the CMOS substrate.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a MEMS structure, comprising:
   providing a MEMS substrate having a first surface;
   forming a first buffer layer on the first surface of the MEMS substrate, wherein a bottom surface of the first buffer layer is in direct contact with the first surface of the MEMS substrate;
   annealing the first buffer layer;
   forming a first roughening layer on the first buffer layer, wherein the first roughening layer is free from being in direct contact with the first surface of the MEMS substrate;
   wherein a lattice constant of the first buffer layer is altered from being out of a lattice constant range defined by a lattice constant of the MEMS substrate and a lattice constant of the first roughening layer to being within the lattice constant range through annealing;
   providing a CMOS substrate having a bump protruding therefrom;
   forming a second roughening layer over the bump, wherein a sidewall of the bump is exposed from the second roughening layer and a top surface of the bump is covered by the second roughening layer; and
   bonding the MEMS substrate to the CMOS substrate via a pillar on the first surface, thereby an entire surface of the first roughening layer is exposed to an air gap ranging from the surface of the first roughening layer to a portion of the CMOS substrate after bonding the MEMS substrate to the CMOS substrate.

2. The method of claim 1, wherein the first buffer layer is an indium tin oxide layer, and an annealing temperature for annealing the first buffer layer is higher than about 200 degrees Celsius.

3. The method of claim 1, wherein the first roughening layer comprises a surface roughness in a range of from about 0.8 µm to about 2 µm.

4. The method of claim 1, wherein forming the first roughening layer comprises supplying a plurality of precursors comprising silane ($SiH_4$), ammonia ($NH_3$), and nitrogen gas ($N_2$).

5. The method of claim 1, further comprising:
   removing the first buffer layer and the first roughening layer from a region of the first surface to be connected to the pillar.

6. The method of claim 1, wherein a thickness of the first roughening layer is greater than a thickness of the first buffer layer.

7. A method for manufacturing a MEMS structure, comprising:
   providing a MEMS substrate having a first surface;
   forming a first buffer layer having a bixbyite cubic structure on the first surface of the MEMS substrate;
   annealing the first buffer layer, the first buffer layer has a rhombohedral corundum type structure after annealing;
   forming a first roughening layer on the first buffer layer;
   providing a CMOS substrate having a second surface and a bump protruding from the second surface;
   forming a second buffer layer having a bixbyite cubic structure on the second surface of the CMOS substrate, wherein the second buffer layer is apart from the first roughening layer;
   annealing the second buffer layer, the second buffer layer has a rhombohedral corundum type structure after annealing;
   forming a second roughening layer on the second buffer layer;
   removing a portion of the second buffer layer and a portion of the second roughening layer to expose at least a portion of a sidewall of the bump and cover a top surface of the bump; and bonding the MEMS substrate to the CMOS substrate through a pillar contacting the first surface and the second surface, thereby an air gap ranging from a surface of the first roughening layer to a portion of a surface of the second roughening layer facing toward the first roughening layer, wherein at least a portion of the surface of the first roughening layer is exposed to the air gap.

8. The method of claim 7, wherein:
after removing the portion of the second buffer layer and the portion of the second roughening layer, a sidewall of the second buffer layer and a sidewall of the second roughening layer are aligned with a sidewall of the bump.

9. The method of claim 8, wherein a thickness of the bump is less than a height of the pillar.

10. The method of claim 7, further comprising:
removing the second buffer layer and the second roughening layer from a bonding area at the second surface prior to bonding the MEMS substrate to the CMOS substrate.

11. A method for manufacturing a MEMS structure, comprising:
providing a MEMS substrate having a first surface;
providing a CMOS substrate having a second surface, wherein the CMOS substrate comprises a bump protruding away from the second surface;
forming a second buffer layer on the second surface of the CMOS substrate;
annealing the second buffer layer, the lattice constant of the second buffer layer after annealing is between about 0.5431 nm and about 0.5507 nm;
forming a second roughening layer on the second buffer layer, wherein the second roughening layer is free from being in direct contact with the CMOS substrate;
removing a portion of the second roughening layer and a portion of the second buffer layer to expose at least a portion of a sidewall of the bump a top surface of the bump is remained covered by the second roughening layer and the second buffer layer; and
bonding the MEMS substrate to the CMOS substrate through a pillar contacting the first surface and the second surface.

12. The method of claim 11, further comprising:
forming a first buffer layer on the first surface of the MEMS substrate prior to bonding the MEMS substrate to the CMOS substrate; and
forming a first roughening layer on the first buffer layer.

13. The method of claim 12, wherein a surface roughness of the first roughening layer is in a range of from about 0.8 µm to about 2.0 µm.

14. The method of claim 12, further comprising:
annealing the first buffer layer by an annealing temperature higher than about 200 degrees Celsius prior to forming the first roughening layer.

15. The method of claim 11, wherein a depositing temperature for forming the second roughening layer is less than about 400 degrees Celsius.

16. The method of claim 11, wherein the second buffer layer comprises indium tin oxide.

17. The method of claim 11, wherein the second roughening layer comprises silicon nitride.

18. The method of claim 11, wherein the pillar comprises a first portion and a second portion, wherein the first portion comprises a metal material, and the second portion comprises a semiconductor material.

19. The method of claim 11, wherein an entire top surface of the second roughening layer is exposed to a space between the MEMS substrate and the CMOS substrate after bonding the MEMS substrate to the CMOS substrate.

20. The method of claim 11, wherein forming the second buffer layer on the second surface of the CMOS substrate comprises:
forming a first portion of the second buffer layer over the bump; and
forming a second portion of the second buffer layer on the second surface of the CMOS substrate, wherein the second portion of the second buffer layer at least partially surround a sidewall of the bump, and the first portion of the second buffer layer is apart from the second portion of the second buffer layer.

* * * * *